(12) United States Patent    (10) Patent No.:    US 8,505,197 B2
Blanchard                    (45) Date of Patent:    Aug. 13, 2013

(54) METHODS OF FABRICATING MULTILAYER SUBSTRATES

(75) Inventor: Chrystelle Lagahe Blanchard, Crolles (FR)

(73) Assignee: Soitec, Bernin (FR)

( * ) Notice: Subject to any disclaimer, the term of this patent is extended or adjusted under 35 U.S.C. 154(b) by 285 days.

(21) Appl. No.: 12/851,227

(22) Filed: Aug. 5, 2010

(65) Prior Publication Data

US 2011/0076849 A1    Mar. 31, 2011

(30) Foreign Application Priority Data

Sep. 28, 2009  (FR) ...................................... 09 56700

(51) Int. Cl.
  *H05K 3/36*    (2006.01)
(52) U.S. Cl.
  USPC ................ 29/830; 29/825; 438/455; 438/459
(58) Field of Classification Search
  USPC .......................... 29/825, 830; 438/455, 459
  See application file for complete search history.

(56) References Cited

U.S. PATENT DOCUMENTS

| 5,234,860 | A |  | 8/1993 | Gluck |  |
|---|---|---|---|---|---|
| 5,340,435 | A | * | 8/1994 | Ito et al. | 438/459 |
| 6,635,572 | B1 |  | 10/2003 | Goruganthu et al. |  |
| 6,790,748 | B2 | * | 9/2004 | Kim et al. | 438/459 |
| 6,830,985 | B2 | * | 12/2004 | Oi et al. | 438/401 |
| 6,841,848 | B2 | * | 1/2005 | MacNamara et al. | 257/618 |
| 6,979,629 | B2 | * | 12/2005 | Yanagita et al. | 438/458 |
| 7,195,988 | B2 | * | 3/2007 | Nemoto et al. | 438/459 |
| 8,158,487 | B2 | * | 4/2012 | Sousbie et al. | 438/431 |
| 2002/0036322 | A1 |  | 3/2002 | Divakauni et al. |  |
| 2003/0008478 | A1 |  | 1/2003 | Abe et al. |  |
| 2003/0092244 | A1 | * | 5/2003 | Oi et al. | 438/455 |
| 2004/0036114 | A1 |  | 2/2004 | Taylor et al. |  |
| 2006/0055003 | A1 |  | 3/2006 | Tomita et al. |  |
| 2007/0072393 | A1 | * | 3/2007 | Aspar et al. | 438/459 |
| 2011/0230003 | A1 | * | 9/2011 | Vaufredaz et al. | 438/67 |

FOREIGN PATENT DOCUMENTS

| JP | 04354371 | A | 12/1992 |
| JP | 09017984 |  | 1/1997 |
| JP | 09509015 | A | 9/1997 |
| JP | 11502674 | A | 3/1999 |

OTHER PUBLICATIONS

Korean Office Action for Korean Application No. 10-2010-0080983 dated Aug. 13, 2011.
Japanese Office Action for Japanese Application No. 2010-167127 dated Jan. 8, 2013, 6 pages.

\* cited by examiner

*Primary Examiner* — Carl Arbes
(74) *Attorney, Agent, or Firm* — TraskBritt

(57) ABSTRACT

A method of fabricating a multilayer substrate may include bonding a front face of a donor substrate to a front face of a receiver substrate by molecular adhesion to form a stack and applying a heat treatment to the stack to consolidate a bond interface between the donor substrate and the receiver substrate. The method may further include thinning a back face of the donor substrate, trimming a periphery of the donor substrate and at least a portion of a periphery of the receiver substrate, and etching the back face of the donor substrate, the periphery of the donor substrate, and the at least a portion of the periphery of the receiver substrate subsequent to thinning the back face of the donor substrate and trimming the periphery of the donor substrate and the at least a portion of the periphery of the receiver substrate.

23 Claims, 3 Drawing Sheets

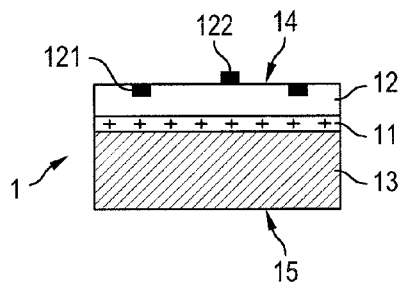
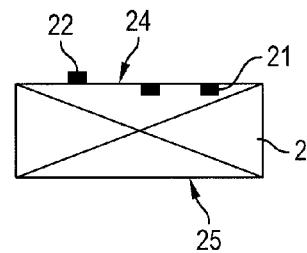
FIG. 1A
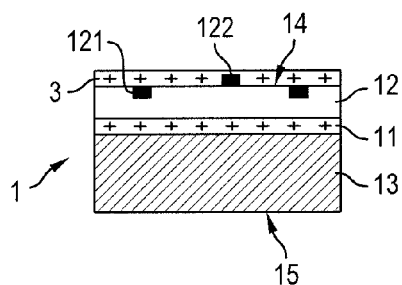
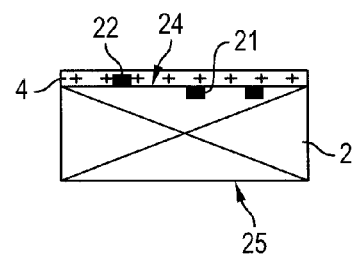
FIG. 1B
FIG. 1C
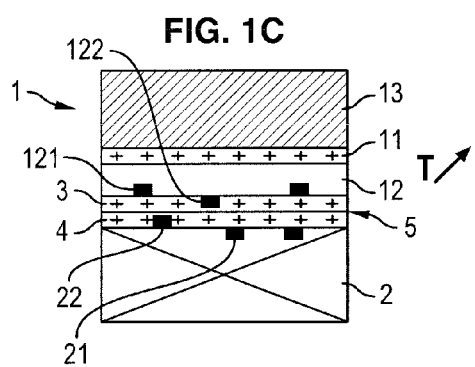
FIG. 1D
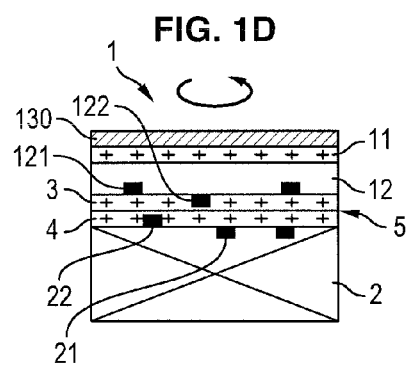
FIG. 1E
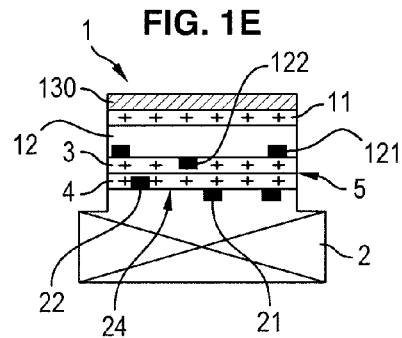
FIG. 1F
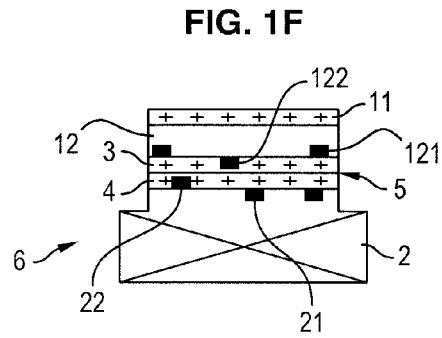

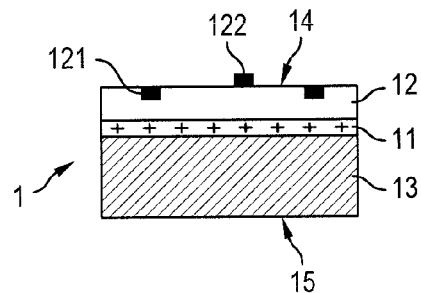
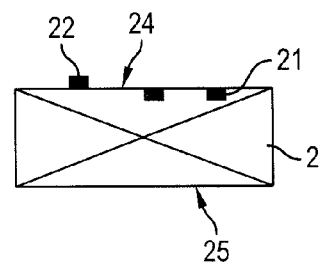
FIG. 2A
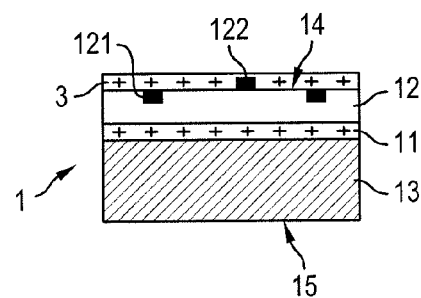
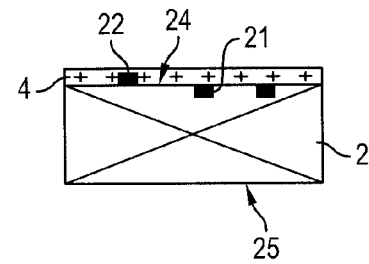
FIG. 2B
FIG. 2C
FIG. 2D
FIG. 2E
FIG. 2F
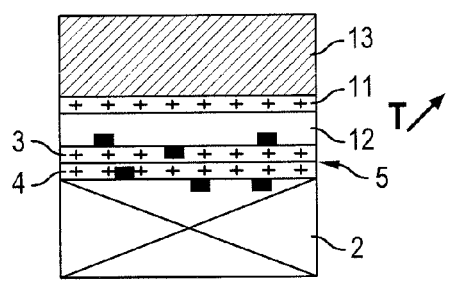
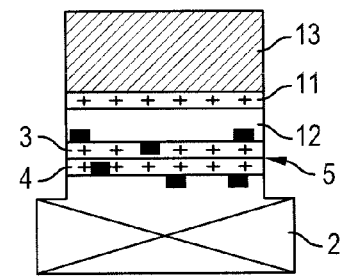
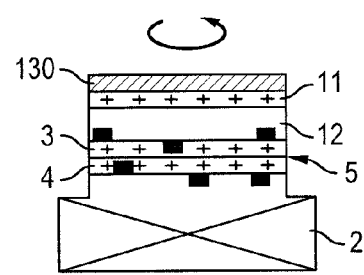
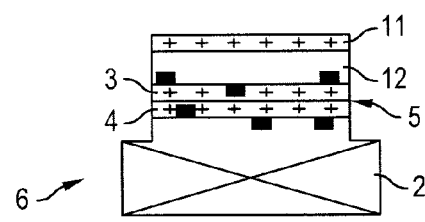

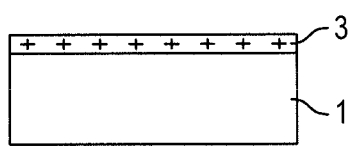
FIG. 3A
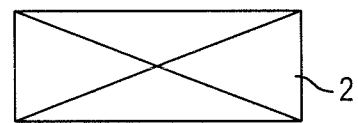
FIG. 3B
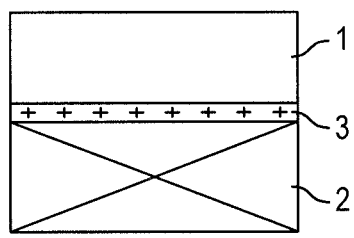
FIG. 3C
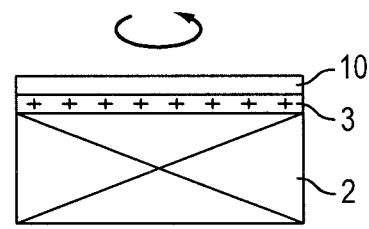
FIG. 3D
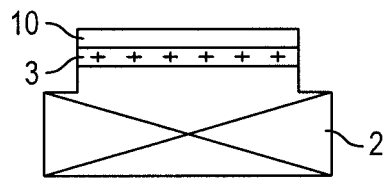
FIG. 3E
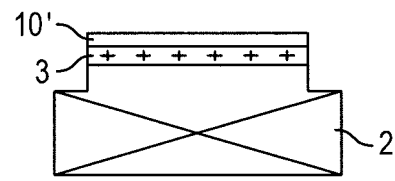

METHODS OF FABRICATING MULTILAYER SUBSTRATES

CROSS-REFERENCE TO RELATED APPLICATION

This application claims priority to French Patent Application Serial No. FR 0956700, in the name of Chrystelle Lagahe Blanchard, filed Sep. 28, 2009, incorporated herein in its entirety by this reference.

TECHNICAL FIELD

The present invention generally relates to the field of fabrication of multilayer substrates for applications in electronics, optics and in optoelectronics and, more particularly, to a process for bonding and transferring a layer of material onto a substrate, implemented during the fabrication of substrates for the aforementioned applications.

BACKGROUND

During a transfer process of this type, two substrates, respectively referred to as a "donor substrate" and a "receiver substrate," are bonded to one another by molecular adhesion. Then, the donor substrate is thinned, for example, by grinding or polishing, in such a manner that a part of the donor substrate is transferred onto the receiver substrate.

Such a process allows multilayer substrates of any given type to be obtained, for example, comprising at least two layers of materials, semiconductor or otherwise.

Such a transfer process also allows a substrate comprising one or more intermediate layers to be obtained, sandwiched between a surface layer removed from the donor substrate and a base layer corresponding to the receiver substrate. It also allows a layer comprising all, or part, of one or more microcomponents from a donor substrate to be transferred to a receiver substrate, as is illustrated, for example, in U.S. Pat. No. 5,234,860 to Gluck, issued Aug. 10, 1993.

One particular example of this type of multilayer substrate consists of one known to those skilled in the art as a "semiconductor-on-insulator" (SeOI).

It has been observed that the substrates fabricated by the above-mentioned transfer techniques generally exhibit an annular region, referred to as a "peripheral ring," in which the bonding between the layers is either nonexistent or of poor quality, owing to the presence of chamfers on the donor and receiver substrates used and commonly available. The presence of these chamfers leads to a low bonding energy around the edges of assembled substrates, or even of a total lack of adhesion.

As a result, the mechanical thinning step, which is conventionally implemented in order to form the transferred layer, tends to cause peripheral partial delamination of the transferred layer at the bonding interface. Furthermore, thermomechanical forces applied to the donor and receiver substrates during the thinning step may lead to a flaking phenomenon at a periphery of the transferred layer, such that the transferred layer then exhibits an irregular circumference.

The existence of a partial delamination and of an irregular circumference of the transferred layer creates a risk of particulate contamination of the equipment or of the substrates themselves, with bits of the transferred layer being able to break off during later processing.

This risk is further accentuated when the process of bonding the two donor and receiver substrates is carried out at a low temperature. This may be the case when the materials brought into contact are not able to withstand high temperatures (e.g., "silicon-on-quartz" (SOQ) or "silicon-on-sapphire" (SOS) substrates) or when at least one of the assembled substrates contains electronic or optoelectronic components, for example.

According to Japanese Patent No. 9-017984 to Shuei, published Jan. 17, 1997, a process for fabrication of a silicon-on-insulator (SOI) structure is known.

Japanese Patent No. 9-017984 makes reference to a prior art process consisting of bonding a donor substrate coated with an insulating layer and a receiver substrate by molecular adhesion, performing an annular trimming of an entirety of the donor substrate and of a part of the receiver substrate, etching a part of the receiver substrate work damaged by trimming, and then grinding a part of the donor substrate to obtain a surface layer of the SOI structure.

However, this process tends to amplify the phenomenon of peripheral partial delamination of the transferred layer at the bonding interface. Indeed, in the case of a bonded structure in which consolidation has only been carried out at a low temperature, the mechanical stresses introduced during the annular mechanical trimming of the entirety of the donor substrate and of a part of the receiver substrate can lead to localized or extended debonding of the bonding interface. The thermomechanical stresses on the structure are indeed significant during this step.

Another trimming process is described in the above-mentioned patent, Japanese Patent No. 9-017984. The trimming process comprises the following steps: trimming of only a part of the donor substrate up to approximately 50 µm prior to a bonding interface, so as not to damage the receiver substrate, and successive selective etching of the residual annular portion of the donor substrate and the oxide layer by means of a tetramethylammonium hydroxide (TMAH) solution.

This trimming process allows etching of the receiver substrate to be avoided.

However, in certain bonded structures, notably in an example in which the donor substrate is a substrate of the SOI type comprising a buried layer of oxide and a surface layer of the substrate includes microcomponents (circuits), the selective etching of the silicon of the donor substrate, previously partially trimmed, will stop at the buried layer of oxide of the donor substrate and at the base of the layer including the circuits; thus, a loosely bonded and irregular layer of 5 µm to 10 µm (thickness of the circuit) not removed, will remain at the periphery of the bonded structure.

BRIEF SUMMARY

The aim of the present invention is to overcome the aforementioned drawbacks of the state of the art and to provide a process for transferring a layer onto a receiver substrate that includes a trimming step. This process avoids the problems of flaking and of delamination of the final substrate and the formation of a transferred layer with irregular circumference. This process is less complex, faster to implement, and less costly than the processes already known in the art.

For this purpose, the invention relates to a process for bonding and transferring a layer of material onto a receiver substrate, the process used during the fabrication of a substrate intended notably for applications in the fields of electronics, optics or optoelectronics.

According to the invention, this process comprises bonding by molecular adhesion the receiver substrate and a donor substrate, applying heat treatment to the aforementioned stack in order to consolidate the bonding interface, thinning the donor substrate by grinding, performing an annular trimming of the donor substrate and of a part of the receiver substrate, and after the aforementioned steps, carrying out a chemical etching step of the exposed surface of the remaining part of the donor substrate and of an exposed surface of the receiver substrate.

According to other advantageous and non-limiting features of the invention, taken alone or in combination:
the grinding may be carried out before the trimming;
the grinding may be carried out after the trimming;
electronic components may be formed within and/or on the donor substrate and/or the receiver substrate prior to the bonding;
the donor substrate may be a bulk substrate;
the chemical etching step may be stopped after removal of the work-damaged region during the grinding step;
the chemical etching step may be followed by a step for polishing of the exposed face of the layer of material coming from the donor substrate;
the donor substrate may be an SOI substrate comprising a silicon base substrate, a buried insulating layer and a surface layer also comprising silicon;
the grinding may comprise removal of a part of the base substrate, and the etch step may be stopped after removal of residue from the base substrate;
a layer of oxide may be formed or deposited on the donor substrate and/or on the receiver substrate prior to the bonding;
the layer of oxide may be planarized in order to smooth out any topography of the component or components present at the surface and to give the surface characteristics required for the bonding by molecular adhesion;
the grinding may be performed up to the point at which a thickness of the donor substrate reaches approximately 50 µm;
the receiver substrate may be trimmed to a depth in a range between approximately 2 µm and 10 µm starting from its surface;
the donor and receiver substrates may be formed from silicon, and the etching solution may be a solution of TMAH with a concentration of 25% by weight in water.

Other features and advantages of the invention will become apparent from its description, which will now be presented with reference to the appended drawings that show, by way of non-limiting examples, several possible embodiments.

BRIEF DESCRIPTION OF THE DRAWINGS

In the drawings:
FIGS. 1A-1F are schematic views showing various steps of a first embodiment of a bonding and transfer process according to the invention;
FIGS. 2A-2F are schematic views showing various steps of a second embodiment of a bonding and transfer process according to the invention; and
FIGS. 3A-3E are schematic views showing various steps of a third embodiment of a bonding and transfer process according to the invention.

DETAILED DESCRIPTION

The process according to the invention is applicable to the bonding of any type of substrate and to the transfer of layers of various natures coming from these substrates.

The invention is, however, particularly applicable in the case where the materials used to fabricate all or part of these substrates are not able to withstand high temperatures, notably greater than 450° C. The term "materials used to fabricate all or part of these substrates" is understood to mean one or more of the layers composing the substrate, or an electronic component formed within and/or on at least one of these substrates.

A first embodiment will now be described in conjunction with FIGS. 1A-1F.

With reference to FIG. 1A, a first substrate 1 is shown, referred to as "donor," of the semiconductor-on-insulator (SeOI) type, which comprises a layer of insulator 11 sandwiched (buried) between a surface layer 12 and a base substrate 13, surface layer 12 and base substrate 13 being made of semiconductor material. Preferably, the insulating layer 11 is a layer of oxide.

One particular application of this process consists of using a donor substrate of the silicon-on-insulator (SOI) type, in which the surface layer 12 and base substrate 13 are made of silicon and the layer of insulator 11 is made of silicon dioxide ($SiO_2$).

A second substrate, referred to as "receiver" substrate 2, can also be seen in FIG. 1A.

FIGS. 1A-1F show an example where electronic components 21, 22, 121, and 122 are present in some of the layers of the donor and receiver substrates, however, the process is also applicable to substrates that do not comprise any electronic components 21, 22, 121, and 122.

When present, the electronic components 21, 22, 121, and 122 may have been formed within and/or on the surface layer 12 and/or within and/or on the receiver substrate 2.

These electronic components 21, 22, 121, and 122 are, for example, circuits that are typically complementary-metal-oxide semiconductor (CMOS) circuits.

Electronic components 121 are formed within the surface layer 12; whereas, electronic components 122 are formed on top of surface layer 12. Electronic components 21 are formed within the receiver substrate 2; whereas, electronic components 22 are formed on top of receiver substrate 2.

The electronic components 21 and/or 22 of the receiver substrate 2 may have been formed directly within or on receiver substrate 2 or may have been the result of a previous transfer of layers, as is the case of the stacking of circuits in three dimensions, known to those skilled in the art by the term "3D stack."

The donor substrate 1 presents two opposing faces, namely a front face referred to as "front face 14," and an opposing face referred to as "back face 15." In a similar manner, the receiver substrate 2 comprises a front face 24 and a back face 25.

As can be seen in FIG. 1B, a layer of oxide is formed or deposited on the front face 14 of the donor substrate 1 and/or on the front face 24 of the receiver substrate 2. These layers of oxide are respectively referenced 3 and 4.

The layers of oxide 3 and 4 are formed by thermal oxidation and/or deposition by chemical vapor deposition (CVD) techniques.

In reference to receiver substrate 2, it is noted that the layer of oxide 4 may completely encapsulate receiver substrate 2, although this is not shown in the figures.

Advantageously, in one example where electronic components are present, the layers of oxide 3 and/or 4 are planarized, so as to smooth out the topography associated with the presence of the components and to give the surface the characteristics later required for bonding by molecular adhesion.

FIG. 1C shows a step for bonding the donor substrate 1 and the receiver substrate 2, carried out in such a manner that the layer or layers of oxide 3 and 4 are sandwiched between the donor substrate 1 and the receiver substrate 2.

After bonding, heat treatment is applied so as to consolidate the bonding interface 5.

In the embodiment illustrated in FIGS. 1A-1F, where donor substrate 1 and receiver substrate 2 comprise electronic components 21, 22, 121, and 122, the temperature of this heat treatment is relatively modest, preferably in the range between approximately 300° C. and 400° C., in order to avoid the degradation of the electronic components 21, 22, 121, and 122.

According to a first embodiment of a process of the invention, shown in FIGS. 1D-1F, the following step consists of carrying out a thinning by grinding of the base substrate 13, in such a manner as to conserve only a thin layer 130 with a thickness that is preferably in a range of between 10 micrometers and 50 micrometers.

This is followed by a trimming step (see FIG. 1E) that consists of removing the peripheral annular edge of the donor substrate 1 and layers of oxide 3 and 4, which may be present and of a part of the receiver substrate 2.

The depth of the trimming into the receiver substrate 2 is preferably in the range between around 2 micrometers and 10 micrometers starting from the front face 24 of receiver substrate 2. In other words, front face 24 is oriented toward the bonding interface 5.

The object of this step is to obtain a clean edge, without flakes, at the periphery of the transferred layer.

For this purpose, the receiver substrate 2 is fixed onto a rotating support and a grinding wheel (not shown), which is also rotating, that is brought into contact with the periphery of the stack of aforementioned layers. The trimming step can thus be performed by means of conventional trimming equipment, known to those skilled in the art as "edge-grinding" or "edge-trimming" equipment.

The trimming step may potentially comprise one or more steps with different depths and widths.

Finally, the last step of the process, as shown in FIG. 1F, consists of a selective etching of the residual layer 130 (e.g., semiconductor material), present on the top of the stack of layers.

The etching may be carried out by means of various etching solutions known to those skilled in the art.

However, where the layers to be etched are made of silicon, the etching is carried out, for example, by means of a solution of NaOH or KOH, or preferably, by means of a chemical solution of TMAH.

Preferably, a TMAH solution is used having a concentration of 25% by weight in water, at a temperature typically in a range of between 70° C. and 90° C. The TMAH solution is a silicon etchant solution that exhibits a high selectivity to oxide. The insulating layer 11 is then used as an etch-stop layer.

By way of example, an etch using a solution of TMAH typically takes 1 minute to 2 hours considering that the etch rate of the residual layer 130 (e.g., a semiconducting layer) is around 25 to 30 micrometers/hour.

Another objective of the etch step is to clean and smooth the trimmed edges. For instance, the mechanical trimming causes an increase in the roughness of the surface processed and generates a large number of particles. The TMAH etch process allows the surface to be smoothed and the trimmed edges to be cleaned to avoid any contamination during the process steps implemented later.

Furthermore, the process according to the invention avoids having to resort to hydrofluoric acid HF (used in certain processes of the prior art), which increases the delamination of the layers and etches the oxide.

At the end of the step shown in FIG. 1F, a final substrate 6 is obtained that comprises the receiver substrate 2 onto which the surface layer 12 has been transferred. The insulating layer 11 may or may not be conserved, depending on the applications targeted.

FIGS. 2A-2F illustrate another embodiment of the process that has been described in conjunction with FIGS. 1A-1F.

FIGS. 2A-2C are identical to FIGS. 1A-1C and, therefore, will not be described again. Identical elements carry the same numerical references.

The process described in FIGS. 2A-2F differs from the preceding one in that the trimming is carried out prior to grinding the base substrate 13. This trimming is illustrated in FIG. 2D.

Subsequently, the grinding of the trimmed base substrate 13 is performed so as to obtain the layer 130, with a thickness in the range between 10 micrometers and 50 micrometers, as previously described.

The step shown in FIG. 2F corresponds to the etch process, which is carried out according to the same procedures and with the same results as that described for the first embodiment of the invention.

In these two embodiments of the invention, it will be noted that the thinning step (FIG. 1D or FIG. 2E, as indicated by an arrow) is always carried out retaining a minimum thickness of the base substrate 13. The advantage of this sequencing is that the final active surface of the layer transferred onto the receiver substrate 2 is never exposed during the trimming step and is therefore protected from any potential particulate contamination or scratching.

A third embodiment will now be described in conjunction with FIGS. 3A-3E. It differs from the two preceding embodiments in that the donor substrate 1 and receiver substrate 2 are both bulk substrates. The donor substrate 1 is also coated with an oxide layer 3. Elements in common with the preceding embodiments carry the same reference numerals.

After the bonding step shown in FIG. 3B, a heat treatment of the aforementioned stack is carried out in order to consolidate the bonding interface 5. This treatment can be conducted up to a temperature of 1100° C. for a duration of 2 hours since the donor substrate 1 and receiver substrate 2 do not comprise any electronic components, as long as the nature of the constituent materials of donor substrate 1 and receiver substrate 2 allow such temperatures.

The steps for thinning by grinding (as indicated by an arrow in FIG. 3C), trimming (FIG. 3D) and etching (FIG. 3E) are then carried out under the conditions previously described. The thinned layer of the donor substrate 1 is indicated by reference numeral 10.

The etch is stopped at the end of the etching time needed to remove the area work-damaged during the grinding process. Layer 10', shown in FIG. 3E, has been thinned by grinding, cleaned by the etch and had its work-damaged area removed. Once again, it will be noted that due to the sequencing of the process of the invention, the active surface of the thinned layer 10' was never exposed during the trimming process and has remained protected.

Two exemplary embodiments of the invention are presented below.

EXAMPLES

Example 1

Fabrication of an SOI Structure Comprising Electronic Components

A silicon receiver substrate has been oxidized and a layer of oxide has been deposited at low temperature (between 200° C. and 500° C.) onto a donor SOI substrate comprising electronic components.

The donor SOI substrate has been planarized until a surface condition is obtained that is compatible with direct bonding by molecular adhesion, in other words until a roughness of less than 3 Å rms (3 angstroms root mean square) has been obtained for a scan width of 2 μm by 2 μm.

After cleaning and surface activation, the two substrates have been assembled. The bonded structure has then been subjected to a heat treatment at 350° C. for 1 hour, in order to consolidate the bonding interface.

The back face of the donor substrate has then been thinned by grinding down to around 35 μm. The trimming step has subsequently been applied to around 3 mm from the edge of the donor substrate.

The bonded structure has then been immersed in a solution of TMAH at 80° C., for 1 hour 30 minutes, which allows selective etching of the silicon (with respect to the oxide) until the entire thickness of residual silicon (from the mechanical support back part of the SOI donor substrate) to be removed.

Example 2

Fabrication of an SOI Structure Using a Bulk Donor Substrate

After having carried out the oxidation of a silicon receiver substrate, the silicon receiver substrate is bonded with a donor substrate also made of silicon.

The structure has been subjected to an annealing step for stabilization of the bonding, using a heat treatment at 1100° C. for 2 hours under an oxygen atmosphere.

Subsequently, thinning of the donor substrate is carried out, followed by trimming the stack to a 0.5 mm to 3 mm width, and to 2 micrometers to 10 micrometers depth into the support.

Following this, an etch has been performed by means of TMAH with a concentration of 25% by weight in water and a temperature of 60° C., in such a manner as to remove the area work-damaged by the thinning step, in other words, the exposed surface of the donor substrate remnant, and to process the front face and the back face exposed by the receiver substrate trimming step. This etch step results in the removal of approximately 0.5 micrometer to 2 micrometers of the thickness.

A final polishing of the SOI structure is then carried out in order to obtain a surface layer of silicon with a thickness in the range of between 3 micrometers and 100 micrometers.

What is claimed is:

1. A method of fabricating a multilayer substrate, the method comprising:
    bonding a front face of a donor substrate to a front face of a receiver substrate by molecular adhesion to form a stack;
    applying a heat treatment to the stack to consolidate a bond interface between the donor substrate and the receiver substrate;
    thinning a back face of the donor substrate to form an active layer;
    trimming a periphery of the donor substrate and at least a portion of a periphery of the receiver substrate; and
    etching the back face of the donor substrate, the periphery of the donor substrate, and the at least a portion of the periphery of the receiver substrate subsequent to thinning the back face of the donor substrate and trimming the periphery of the donor substrate and the at least a portion of the periphery of the receiver substrate;
    wherein a surface of the active layer is not exposed prior to etching the back face of the donor substrate during the thinning of the back face of the donor substrate and the trimming of the periphery of the donor substrate.

2. The method of claim 1, wherein thinning the back face of the donor substrate comprises grinding the back face of the donor substrate.

3. The method of claim 1, wherein trimming the periphery of the donor substrate and the at least a portion of the periphery of the receiver substrate comprises performing an annular trimming of the periphery of the donor substrate and the at least a portion of the periphery of the receiver substrate.

4. The method of claim 1, further comprising thinning the back face of the donor substrate prior to trimming the periphery of the donor substrate and the at least a portion of the periphery of the receiver substrate.

5. The method of claim 1, further comprising trimming the periphery of the donor substrate and the at least a portion of the periphery of the receiver substrate prior to thinning the back face of the donor substrate.

6. The method of claim 1, further comprising at least one of:
    forming at least one electronic component on at least one of the front face of the donor substrate and the front face of the receiver substrate; and
    forming at least one electronic component in at least one of the front face of the donor substrate and the front face of the receiver substrate.

7. The method of claim 1, further comprising selecting the donor substrate to comprise a bulk substrate.

8. The method of claim 1, further comprising stopping the chemical etching of the back face and the periphery of the donor substrate and the at least a portion of the periphery of the receiver substrate after removing any regions damaged by at least one of the thinning of the back face of the donor substrate and the trimming of the periphery of the donor substrate and the at least a portion of the periphery of the receiver substrate.

9. The method of claim 1, further comprising polishing an exposed face of the donor substrate subsequent to the etching of the back face of the donor substrate, the periphery of the donor substrate, and the at least a portion of the periphery of the receiver substrate.

10. The method of claim 1, further comprising selecting the donor substrate to comprise a silicon base substrate, a buried insulating layer, and a silicon surface layer.

11. The method of claim 10, wherein thinning the back face of the donor substrate comprises removing at least a portion of the silicon base substrate.

12. The method of claim 1, wherein thinning the back face of the donor substrate comprises thinning the donor substrate to a thickness of about 50 μm.

13. The method of claim 1, wherein trimming the at least a portion of the periphery of the receiver substrate comprises trimming the periphery of the receiver substrate to a depth between about 2 μm and about 10 μM from the front face of the donor substrate.

14. The method of claim 1, wherein chemically etching further comprises chemically etching silicon from the donor substrate and the receiver substrate with an etching solution comprising tetramethylammonium hydroxide.

15. The method of claim 14, wherein chemically etching further comprises chemically etching silicon from the donor substrate and the receiver substrate with an etching solution comprising about 25% tetramethylammonium hydroxide by weight.

16. The method of claim 1, wherein applying a heat treatment comprises heating the stack to a temperature above approximately 300° C.

17. The method of claim 16, wherein applying a heat treatment comprises heating the stack to a temperature between approximately 300° C. and approximately 400° C.

18. The method of claim 17, wherein applying a heat treatment further comprises maintaining the stack at a temperature between approximately 300° C. and approximately 400° C. for a period of time longer than approximately one hour.

19. The method of claim 1, further comprising providing a layer of oxide on at least one of the front face of the donor substrate and the front face of the receiver substrate prior to bonding.

20. The method of claim 19, wherein providing a layer of oxide on at least one of the front face of the donor substrate and the front face of the receiver substrate comprises at least one of forming a layer of oxide by thermal oxidation and depositing a layer of oxide by chemical vapor deposition.

21. The method of claim 1, wherein the etching of the back face of the donor substrate, the periphery of the donor substrate, and the at least a portion of the periphery of the receiver substrate comprises etching without HF.

22. A method of fabricating a multilayer semiconductor-on-insulator substrate including an active layer, the method comprising:
    forming at least one electronic component on or in at least one of a front face of a donor substrate and a front face of a receiver substrate;
    providing a layer of oxide on at least one of the front face of the donor substrate and the front face of the receiver substrate;
    bonding the front face of the donor substrate to the front face of the receiver substrate by molecular adhesion to form a stack;
    applying a heat treatment to the stack to consolidate a bond interface between the donor substrate and the receiver substrate;
    removing material of the donor substrate from a back face of the donor substrate;
    trimming an annular periphery of the donor substrate and at least a portion of an annular periphery of the receiver substrate; and
    etching the back face and the annular periphery of the donor substrate and the at least a portion of the annular periphery of the receiver substrate subsequent to removing material of the donor substrate from the back face of the donor substrate and trimming the annular periphery of the donor substrate and the at least a portion of the annular periphery of the receiver substrate, wherein a surface of the active layer is not exposed prior to etching the back face and the annular periphery of the donor substrate and the at least a portion of the annular periphery of the receiver substrate during the trimming of the periphery of the donor substrate and the removal of material of the donor substrate from the back face of the donor substrate.

23. A method of fabricating a bulk multilayer semiconductor-on-insulator substrate including an active layer, the method comprising:
    forming at least one electronic component on or in at least one of a front face of a bulk donor substrate and a front face of a bulk receiver substrate;
    providing a layer of oxide on at least one of the front face of the bulk donor substrate and the front face of the bulk receiver substrate;
    bonding the front face of the bulk donor substrate to the front face of the bulk receiver substrate by molecular adhesion to form a stack;
    applying a heat treatment to the stack to consolidate a bond interface between the bulk donor substrate and the bulk receiver substrate;
    grinding a back face of the bulk donor substrate;
    trimming an annular periphery of the bulk donor substrate and at least a portion of an annular periphery of the bulk receiver substrate; and
    etching the back face and the annular periphery of the bulk donor substrate and the at least a portion of the annular periphery of the bulk receiver substrate subsequent to removing material of the bulk donor substrate from the back face of the bulk donor substrate and trimming the annular periphery of the bulk donor substrate and the at least a portion of the annular periphery of the bulk receiver substrate, wherein a surface of the active layer is not exposed prior to etching the back face and the annular periphery during the trimming of the annular periphery of the bulk donor substrate and the at least a portion of the annular periphery of the bulk receiver substrate.

* * * * *